(12) United States Patent
Pizzetti et al.

(10) Patent No.: US 12,031,214 B2
(45) Date of Patent: Jul. 9, 2024

(54) CHEMICAL COMPOSITION FOR REMOVING NICKEL-PLATINUM ALLOY RESIDUES FROM A SUBSTRATE, AND METHOD FOR REMOVING SUCH RESIDUES

(71) Applicant: TECHNIC FRANCE, Saint Denis (FR)

(72) Inventors: Christian Pizzetti, La Batie Divisin (FR); Marine Audouin, Grenoble (FR)

(73) Assignee: TECHNIC FRANCE, Saint Denis (FR)

( * ) Notice: Subject to any disclaimer, the term of this patent is extended or adjusted under 35 U.S.C. 154(b) by 0 days.

(21) Appl. No.: 17/642,736

(22) PCT Filed: Sep. 28, 2020

(86) PCT No.: PCT/FR2020/051693
§ 371 (c)(1),
(2) Date: Mar. 14, 2022

(87) PCT Pub. No.: WO2021/058927
PCT Pub. Date: Apr. 1, 2021

(65) Prior Publication Data
US 2022/0325420 A1    Oct. 13, 2022

(30) Foreign Application Priority Data
Sep. 27, 2019 (FR) .................................... 1910737

(51) Int. Cl.
*C23F 1/28* (2006.01)
(52) U.S. Cl.
CPC .................................... *C23F 1/28* (2013.01)

(58) Field of Classification Search
CPC .. C23F 1/28; H01L 29/66507; H01L 29/7833; H01L 21/28052; H01L 21/28518; H01L 21/32134
(Continued)

(56) References Cited

U.S. PATENT DOCUMENTS

| 2008/0315322 A1 | 12/2008 | Obeng et al. |
| 2012/0231632 A1 | 9/2012 | Takahashi et al. |

(Continued)

FOREIGN PATENT DOCUMENTS

| WO | WO 2013/170130 A1 | 11/2013 |
| WO | WO 2014/178326 A1 | 11/2014 |

OTHER PUBLICATIONS

French Search Report and English translation of the Written Opinion for French Application No. 1910737, dated Jun. 11, 2020.
(Continued)

*Primary Examiner* — Duy Vu N Deo
(74) *Attorney, Agent, or Firm* — Birch, Stewart, Kolasch & Birch, LLP

(57) ABSTRACT

The present invention relates to an aqueous chemical composition C for removing from a substrate selectively under heat residues of a nickel-platinum alloy containing at least 8% by weight of Pt compared to the total weight of nickel-platinum alloy,
characterised in that it is prepared by mixing a composition B comprising bromide ions and a composition H comprising hydrogen peroxide such that in the composition C, at the moment of mixing, the molar concentration of bromide ions is comprised between 0.15 mol/L and 0.45 mol/L and the molar ratio of hydrogen peroxide with respect to bromide ions is comprised between 1.1 and 2.
The invention also pertains to a method for selectively removing nickel-platinum alloy residues containing at least
(Continued)

8% by weight of Pt compared to the total weight of nickel-platinum alloy from a substrate, comprising the following steps:
- preparing under heat a chemical composition C according to any one of claims 1 to 3,
- placing the hot chemical composition C and the substrate in contact for a sufficient duration to remove the nickel-platinum alloy residues from the substrate.

9 Claims, 5 Drawing Sheets

(58) Field of Classification Search
USPC .......................................................... 216/55
See application file for complete search history.

(56) References Cited

U.S. PATENT DOCUMENTS

| | | | |
|---|---|---|---|
| 2015/0162213 A1* | 6/2015 | Chen | H01L 21/32134 |
| | | | 438/754 |
| 2016/0013047 A1* | 1/2016 | Ogawa | C11D 3/3947 |
| | | | 134/95.1 |
| 2016/0056054 A1 | 2/2016 | Takahashi et al. | |
| 2020/0010959 A1* | 1/2020 | Hong | H01L 21/30617 |

OTHER PUBLICATIONS

International Search Report for International Application No. PCT/FR2020/051693, dated Jan. 29, 2021.

* cited by examiner

CHEMICAL COMPOSITION FOR REMOVING NICKEL-PLATINUM ALLOY RESIDUES FROM A SUBSTRATE, AND METHOD FOR REMOVING SUCH RESIDUES

TECHNICAL FIELD OF THE INVENTION

The present invention relates to a chemical composition for removing nickel-platinum alloy residues from a substrate, and a method for removing such residues.

PRIOR ART

During the manufacture of MOS (metal-oxide-semiconductor) transistors, the metal connections are connected to the substrate through silicides ($M_xSi_y$) which are formed during one or more high temperature annealings, after having deposited a thin layer of metal or alloy surmounted by a thin layer of titanium nitride making it possible to protect the metal layer from oxidation.

FIGS. 1A, 1B, 1C, 1D, and 1E illustrate different states of the structure 1 intended to form the MOS transistor, during the steps of manufacturing said transistor.

In FIG. 1A, the structure 1 comprises an N or P type implanted zone 2, a gate 3 composed of polysilicon and titanium nitride, deposited on a layer of an insulating material with high dielectric constant, and a spacer 4 made of a dielectric material, such as silicon nitride SiN. With reference to FIG. 1B, the metal layer 5 and the titanium nitride TiN layer 6 are deposited. The metal layer generally comprises a nickel-platinum alloy layer (containing 8 to 15% by weight of platinum) for reasons of thermal stability.

A first silicidation annealing is carried out, at low temperature, to form a first metal rich phase, comprising a nickel silicide $Ni_2Si$ layer 7 illustrated in FIG. 1C. A second annealing makes it possible to transform the $Ni_2Si$ layer 7 into a NiSi layer 8 as illustrated in FIG. 1E.

However, the first silicidation annealing leads to the formation of residues of the nickel-platinum alloy layer which have not been transformed, as shown in FIG. 1D. These residues have to be removed in a selective manner with respect to the dielectric layer situated under the gate and with respect to the nickel silicide $Ni_2Si$ formed, these latter then being exposed. The presence of platinum in the alloy constituting these residues makes their dissolution all the more difficult the higher the concentration of platinum.

When platinum is present in the nickel-platinum alloy at a concentration less than 8% by weight, then solutions normally used for the removal of pure nickel or cobalt are efficient. Among these solutions, the most frequently encountered is the mixture HCl (37% by weight) and hydrogen peroxide solution (30% by weight) called SC2 in proportions of $HCl:H_2O_2:H_2O$ ranging from 1:1:50 to 1:1:10 by volumetric ratio and at temperatures comprised between 50 and 70° C.

Two compositions have been developed by industry for removing a nickel-platinum Ni—Pt alloy layer containing at least 8% by weight of platinum.

The first composition is a mixture of concentrated hydrochloric acid and concentrated nitric acid, the customary name of which is Aqua Regia. This mixture is in general efficient for dissolving the residues, but has on the other hand a too high aggressiveness vis-à-vis the silicide formed. In addition, this composition can only be used after a certain period following mixing, and for a relatively short duration, generally comprised between one and three hours. Finally, the use of this composition necessitates a preliminary step of removal of the titanium nitride layer.

The second composition is a mixture at the point of use of concentrated sulphuric acid heated to 60-80° C. and 30% by weight hydrogen peroxide, the customary name of which is S.P.M. The mixture thereby produced makes it possible to reach a process temperature comprised between 180° C. and 200° C., which enables a relatively rapid removal of the residues. This mixture further makes it possible to remove the titanium nitride layer that covers the nickel-platinum Ni—Pt alloy layer.

The use of this S.P.M. composition has however several drawbacks. The very high temperature necessary for the removal of platinum makes the solution aggressive vis-à-vis the constituent materials of the treatment equipment but also and especially vis-à-vis metals present in the structure of the transistor (notably the metal of the gate) which may lead to significant losses in the functional performance of the transistor.

BRIEF DESCRIPTION OF THE INVENTION

An aim of the invention is to overcome the drawbacks detailed previously.

In the present invention, Ni designates nickel and Pt designates platinum.

The invention notably aims to provide an aqueous chemical composition for removing residues of a nickel-platinum alloy from a substrate, in particular residues of a Ni—Pt alloy containing at least 8% by weight of Pt. The composition according to the invention enables efficient removal of said residues while avoiding degrading the substrate, and quite particularly the silicon and/or titanium nitride constituting the substrate.

The aim of the invention is also to provide such an aqueous chemical composition making it possible to remove residues of a nickel-platinum alloy, containing in particular at least 8% by weight of Pt, formed by annealing a structure comprising a nickel-platinum alloy layer during the manufacture of a transistor, in an efficient manner and while avoiding degrading the structure, in particular the gate of the transistor and/or the constituent layers of the transistor.

To this end, the invention relates to a chemical composition for selectively removing nickel-platinum alloy residues from a substrate, mainly characterised in that it comprises bromide ions at a concentration by weight comprised between 3% and 8%, hydrogen peroxide aqueous solution at a concentration by weight comprised between 2% and 6%, and water.

The present invention relates to an aqueous chemical composition C for removing from a substrate selectively under heat residues of a nickel-platinum alloy containing at least 8% by weight of Pt compared to the total weight of nickel-platinum alloy, characterised in that it is prepared by mixing a composition B comprising bromide ions and a composition H comprising hydrogen peroxide such that in the composition C, at the moment of mixing, the molar concentration of bromide ions is comprised between 0.15 mol/L and 0.45 mol/L and the molar ratio of hydrogen peroxide with respect to bromide ions is comprised between 1.1 and 2.

The present invention also relates to the use of the aqueous chemical composition C according to the invention to remove from a substrate selectively under heat residues of a nickel-platinum alloy containing at least 8% by weight of Pt compared to the total weight of nickel-platinum alloy. The substrate is in particular a transistor.

Finally, the present invention relates to a method for selectively removing nickel-platinum alloy residues containing at least 8% by weight of Pt compared to the total weight of nickel-platinum alloy from a substrate, in particular from a transistor, comprising the following steps:

preparing under heat an aqueous chemical composition C according to the invention, contacting the hot chemical composition and the substrate for a sufficient duration to remove the nickel-platinum alloy residues from the substrate.

According to an embodiment, the chemical composition is constituted uniquely, or essentially, of a source of bromide ions, hydrogen peroxide aqueous solution, and water.

According to other aspects, the composition according to the invention has the following different characteristics taken alone or according to all technically possible combinations thereof:

the bromide ions are derived from hydrobromic acid, hydrogen bromide or a bromide salt;

the composition B according to the invention further comprises chloride ions at a molar ratio with respect to bromide ions less than or equal to 0.25;

the molar concentration of hydrogen peroxide aqueous solution is greater than the molar concentration of bromide ions.

The invention also pertains to a method for selectively removing nickel-platinum alloy residues from a substrate, comprising the following steps:

mixing bromide ions and hydrogen peroxide aqueous solution in water to form a chemical composition C such as described previously, placing the chemical composition and the substrate in contact for a sufficient duration to remove the nickel-platinum alloy residues from the substrate.

According to other aspects, the method according to the invention has the following different features taken alone or according to all technically possible combinations thereof:

the chemical composition is prepared by mixing water at a temperature greater than 75° C., with the bromide ions and the hydrogen peroxide aqueous solution;

the chemical composition is manufactured by injecting at the point of use, into a flow of water heated to a temperature greater than 75° C., the bromide ions and the hydrogen peroxide aqueous solution;

the bromide ions are derived from hydrobromic acid having a mass concentration of 48% and are injected into the flow of heated water at a flow rate comprised between 2% and 5.5% of the water volumetric flow rate, and the hydrogen peroxide aqueous solution has a mass concentration of 30% and is injected into the flow of heated water at a flow rate comprised between 2 and 6% of the water volumetric flow rate;

the bromide ions are injected into the flow of heated water at a certain flow rate in such a way as to obtain a concentration by weight of bromide ions comprised between 3% and 8%;

the chemical composition is at a temperature greater than or equal to 70° C. while it is placed in contact with the substrate;

the substrate is a transistor structure comprising nickel-platinum alloy residues formed by annealing during the manufacture of the transistor.

DESCRIPTION OF THE FIGURES

Other advantages and features of the invention will become clear on reading the following description given as an illustrative and non-limiting example, with reference to the following appended figures:

In FIGS. 5 to 8, "E"=water, "B"=composition B, "H"=composition H, "C"=composition C, "S"=substrate, "PC"=point of contact, "PIB"=injection point of the composition B, "PIH"=injection point of the composition H, "R"=tank.

DETAILED DESCRIPTION OF EMBODIMENTS OF THE INVENTION

Figure 1:
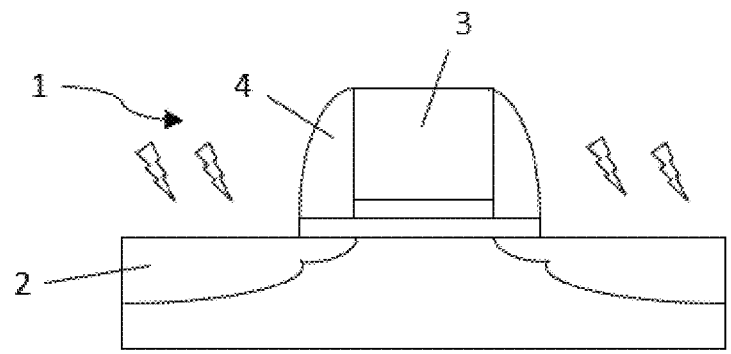
FIG. 1A is a sectional diagram of a structure intended to form a transistor.
FIG. 1B is a sectional diagram of the structure of FIG. 1A after deposition of a metal layer and a titanium nitride TiN layer.
FIG. 1C is a sectional diagram of the structure of FIG. 1B after carrying out a first silicidation annealing.
FIG. 1D is a sectional diagram of the structure of FIG. 1C after an attempt of removal of nickel-platinum alloy residues.
FIG. 1E is a sectional diagram of the structure of FIG. 1D after carrying out a second annealing.
Figure 1:
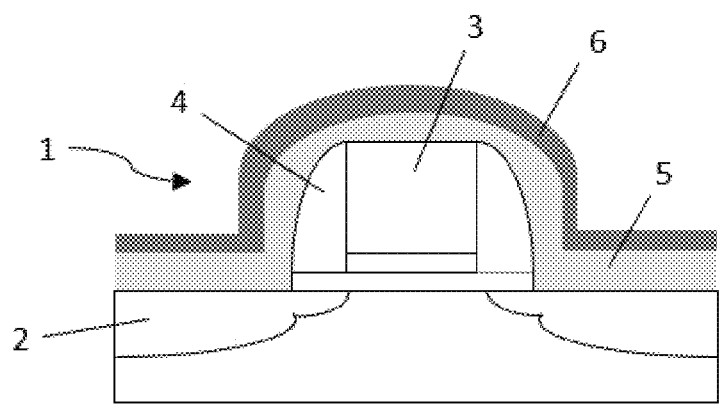
Figure 1:
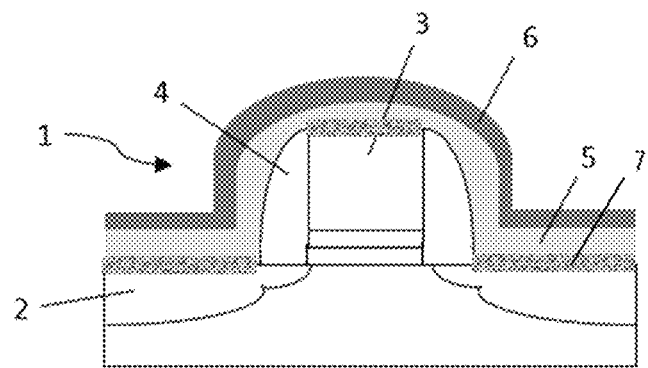
Figure 1:
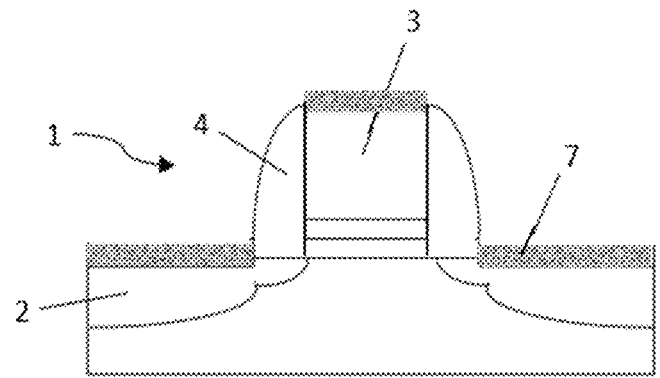
Figure 1E:
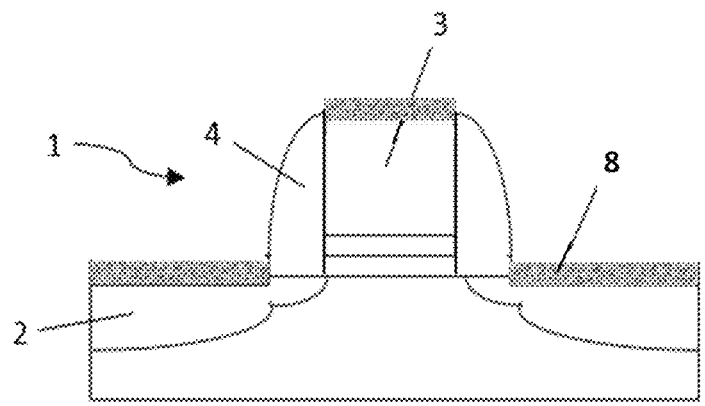

Aqueous Composition C According to the Invention

The Applicant has discovered that a chemical composition comprising bromide ions at a concentration by weight comprised between 3% and 8%, hydrogen peroxide aqueous solution at a concentration by weight comprised between 2% and 6%, compared to the total weight of the composition, makes it possible to remove fully nickel-platinum alloy residues from a substrate, in an efficient and selective manner vis-à-vis said substrate. In particular, the chemical composition according to the invention is an aqueous chemical composition C, suited to removing from a substrate selectively under heat nickel-platinum alloy residues containing at least 8% by weight of Pt compared to the total weight of nickel-platinum alloy, characterised in that it is prepared by mixing a composition B comprising bromide ions and a composition H comprising hydrogen peroxide such that in the composition C, at the moment of mixing, the molar concentration of bromide ions is comprised between 0.15 mol/L and 0.45 mol/L and the molar ratio of hydrogen peroxide with respect to bromide ions is comprised between 1.1 and 2.

Advantageously, the composition C is prepared by the exclusive mixing of the composition B, the composition H and optionally water. Thus, preferably, the composition C only comprises elements introduced by the compositions B and H, elements resulting from the reaction of the compositions B and H, if appropriate the additional water optionally introduced, with the exclusion of any other element. In other words, preferably, the composition C is constituted of elements introduced by the compositions B and H, elements resulting from the reaction of the compositions B and H, and if appropriate the additional water optionally introduced.

"At the moment of mixing" is notably taken to mean when mixing the composition B and the composition H, and optionally the additional water.

Nickel-platinum alloy residues notably result from the implementation of a silicidation of a substrate during the manufacture of a transistor, that is to say a step consisting in forming a silicide (chemical compound comprising silicon and a metal) by thermal annealing. At the end of silicidation, the substrate comprises the structure intended to form the transistor, which is covered with residues of a nickel-platinum alloy not transformed during the reaction. This nickel-platinum alloy is going to be at least 8% by weight of platinum, advantageously 8% to 15% by weight of platinum, compared to the total weight of nickel-platinum alloy.

The composition according to the invention advantageously makes it possible to remove these residues efficiently and selectively vis-à-vis the silicide formed and the dielectric layer situated under the gate of the transistor, in a sufficiently short time to be compatible with industrial needs. Without being linked by a particular theory, it may be thought that these properties derive from the mixing of bromide ions with hydrogen peroxide forming dibromine $Br_2$, releasing $Br°$ free radicals and favouring the radical decomposition of the hydrogen peroxide aqueous solution into $HO°$ in the composition, these radicals being capable of forming complexes with platinum relatively easily.

The selective removal takes place under heat, that is to say at a temperature greater than or equal to 70° C., in particular greater than or equal to 75° C., more particularly comprised between 75° C. and 95° C.

The chemical entities reacting rapidly with each other, the contents of bromide ions and hydrogen peroxide given correspond to the contents present when mixing, that is to say during mixing of the composition B with the composition H, the additional water, when it is introduced being present at the moment of mixing.

Composition B

The composition B comprises bromide ions. Advantageously, the composition B comprises a source of bromide ions. A bromide ion is an ion of formula Br—.

The source of bromide ions may be hydrobromic acid, a bromide salt or hydrogen bromide (gas). In particular, the composition B comprises hydrobromic acid, a bromide salt or hydrogen bromide.

Hydrobromic acid is an aqueous solution of hydrogen bromide. It is obtained by dissolution of HBr gas in water. It is an aqueous solution containing bromide ions and hydronium ions. In particular, the hydrobromic acid has a mass concentration of 48%, that is to say 48% by weight of HBr compared to the total weight of aqueous solution.

Hydrogen bromide is a gas of formula HBr.

A bromide salt is a salt comprising bromide ions, such as for example sodium bromide, potassium bromide or ammonium bromide, preferably ammonium bromide.

In a first alternative, the composition B is selected from among an aqueous composition comprising hydrobromic acid, an aqueous composition comprising at least one bromide salt or mixture thereof.

Preferably, the composition B is selected from among hydrobromic acid, an aqueous composition comprising at least one bromide salt or mixture thereof.

In a second alternative, the composition B is a gaseous composition comprising hydrogen bromide.

Preferably, the composition B is hydrogen bromide.

In a third alternative, the composition B is a solid composition comprising at least one bromide salt.

The molar concentration of bromide ions in the composition C according to the invention, when mixing of the composition B with the composition H, is comprised between 0.15 mol/L and 0.45 mol/L, preferably between 0.2 mol/L and 0.4 mol/L.

When the source of bromide ions is hydrobromic acid, the volumetric concentration of hydrobromic acid in the composition C is preferably comprised between 2% and 5.5%, in particular when the hydrobromic acid has a mass concentration of 48%.

When the source of bromide ions is hydrobromic acid, said hydrobromic acid preferably has a mass concentration of 48%. This product at the indicated mass concentration is easily found commercially, which facilitates the preparation of the composition B.

When the concentration by weight of bromide ions in the composition is greater than 8%, the efficiency is not improved compared to a concentration by weight less than 8%, and the solubility of the dibromine $Br_2$ formed in water is then exceeded, which leads to the necessity of eliminating the dibromine $Br_2$ thus generated in gaseous form.

Similarly, when the molar concentration of bromide ions in the composition C is greater than 0.45 mol/L, the efficiency is not improved compared to a molar concentration less than 0.45 mol/L, and the solubility of the dibromine $Br_2$ formed in the water is then exceeded, which leads to the necessity of eliminating the dibromine $Br_2$ thus generated in gaseous form.

When the concentration by weight of bromide ions in the composition is less than 3%, the efficiency of the composition is reduced.

Similarly, when the molar concentration of bromide ions in the composition C is less than 0.15 mol/L, the efficiency of the composition C is reduced.

Preferably, the chemical composition of the invention further comprises hydrochloric acid, which makes it possible to further improve the efficiency of the cleaning. More specifically, the bromide ions are obtained by a mixture of hydrobromic acid and hydrochloric acid, hydrochloric acid having a concentration by weight less than or equal to 15% in said mixture of hydrobromic acid and hydrochloric acid.

In particular, the composition B according to the invention further comprises chloride ions at a molar ratio with respect to bromide ions less than or equal to 0.25.

The chloride ions/bromide ions molar ratio in the composition B is thus less than or equal to 0.25, preferably comprised between 0 and 0.25.

Thus, in the composition C, at the moment of mixing the composition B and the composition H, the chloride ions/bromide ions molar ratio is less than or equal to 0.25, preferably comprised between 0 and 0.25.

The source of chloride ions may be hydrochloric acid.

Hydrochloric acid is an aqueous solution of hydrogen chloride. It is obtained by dissolution of HCl gas in water. It is an aqueous solution containing chloride ions and hydronium ions. In particular, the hydrochloric acid has a mass concentration of 37%, that is to say 37% by weight of HCl compared to the total weight of aqueous solution.

A chloride ions/bromide ions molar ratio greater than 0.25 in the composition C hardly increases further the efficiency of the cleaning, and the vapour pressure of hydrochloric acid in the mixture increases significantly.

Advantageously, the composition B is constituted of a source of bromide ions, optionally water and optionally a source of chloride ions. More advantageously, the composition B is constituted of a source of bromide ions, water and optionally a source of chloride ions.

In particular, the composition B does not comprise anions other than bromide ions and optionally chloride ions.

Composition H

The composition H comprises hydrogen peroxide.

Hydrogen peroxide is a chemical compound of formula $H_2O_2$. Its aqueous solution is called hydrogen peroxide aqueous solution.

The source of hydrogen peroxide is in particular hydrogen peroxide aqueous solution.

Thus, preferably, the composition H comprises hydrogen peroxide aqueous solution. More preferentially, the composition H is hydrogen peroxide aqueous solution, then signifying that the composition H consists of hydrogen peroxide aqueous solution and does not comprise other elements.

The hydrogen peroxide aqueous solution preferably has a mass concentration of 30%, that is to say 30% by weight of $H_2O_2$ compared to the total weight of aqueous solution.

The molar ratio of hydrogen peroxide/bromide ions in the composition C, when mixing, is comprised between 1.1 and 2. Thus, the molar concentration of hydrogen peroxide in the composition C, when mixing, may be comprised between 0.16 mol/L and 0.9 mol/L.

When the concentration by weight of hydrogen peroxide aqueous solution in the composition is greater than 6%, the efficiency is not improved compared to a concentration by weight less than 6%.

Similarly, when the molar concentration of hydrogen peroxide in the composition C is greater than 0.9 mol/L, or when the molar ratio of hydrogen peroxide/bromide ions in the composition C is greater than 2, the efficiency is not improved compared to a molar concentration less than 0.9 mol/L.

When mixing, the molar concentration of hydrogen peroxide in the composition C is greater than the molar concentration of bromide ions in the composition C. In the opposite case, the efficiency of the composition is reduced.

Method for Removal According to the Invention

The present invention also pertains to a method for selectively removing residues of a nickel-platinum alloy containing at least 8% by weight of Pt compared to the total weight of nickel-platinum alloy from a substrate, advantageously from a transistor, comprising the use of the aqueous chemical composition C according to the invention. The nickel-platinum alloy of the substrate comprises in particular at least 8% by weight of platinum, advantageously 8% to 15% by weight of platinum, compared to the total weight of nickel-platinum alloy.

Preferably, the use of the chemical composition according to the invention consists in placing the substrate to treat in contact with the aqueous composition C according to the invention.

Advantageously, the present invention relates to a method for selectively removing residues of a nickel-platinum alloy containing at least 8% by weight of Pt compared to the total weight of nickel-platinum alloy from a substrate, comprising the following steps: a) preparing under heat an aqueous chemical composition C according to the invention, b) placing the hot aqueous chemical composition C and the substrate in contact for a sufficient duration to remove the nickel-platinum alloy residues from the substrate.

Step a)

In particular, the aqueous composition C is prepared by mixing a composition B comprising bromide ions and a composition H comprising hydrogen peroxide such that in the composition C, at the moment of mixing, the molar concentration of bromide ions is comprised between 0.15 mol/L and 0.45 mol/L and the molar ratio of hydrogen peroxide with respect to bromide ions is comprised between 1.1 and 2.

More particularly, the compositions B, H and C are such as described above.

Advantageously, the composition B is heated to a temperature greater than 70° C., more preferentially greater than 75° C., in particular comprised between 75° C. and 95° C., before mixing it with the composition H.

In particular, the aqueous composition C is prepared by mixing a composition B, a composition H and water. More particularly, the water is heated to a temperature greater than 70° C., more preferentially greater than 75° C., in particular comprised between 75° C. and 95° C., before mixing it with the compositions B and H.

Alternatively, the water and the composition B are mixed and heated to a temperature greater than 70° C., more preferentially greater than 75° C., in particular comprised between 75° C. and 95° C., before mixing it with the composition H.

Figure 5:
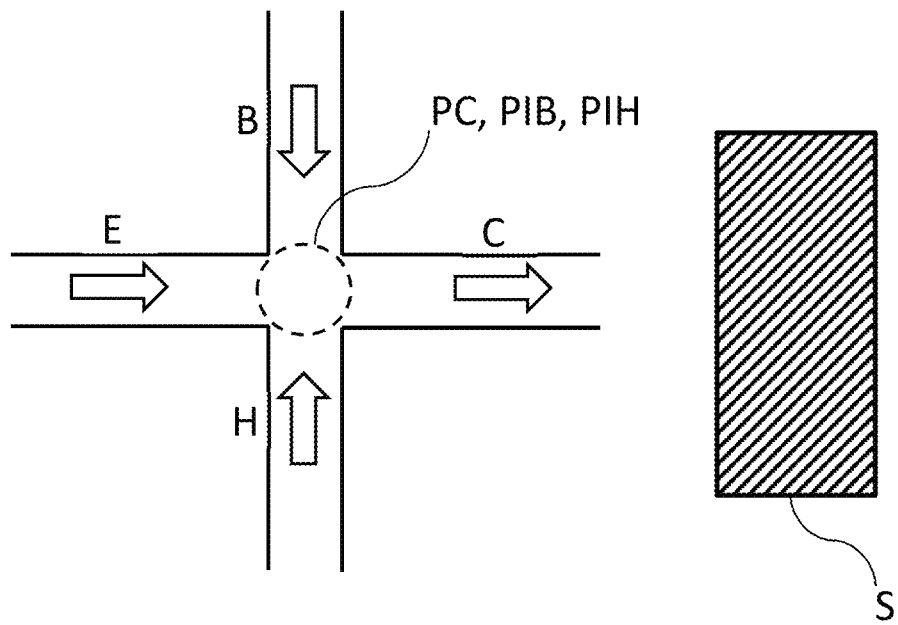
FIG. 5 is a diagram of a first embodiment of the step of preparation of the aqueous chemical composition C according to the invention.

In a first alternative, as illustrated in FIG. 5, the mixing step takes place by injecting the composition B and the composition H into a flow of water E at a same injection point to form a flow of aqueous composition C according to the invention. The injection point PIB of the composition B and the injection point PIH of the composition H is common and then corresponds to the point of contact PC of the two compositions B and H.

Preferably, the injections of the compositions B and H take place simultaneously.

In this alternative, the molar concentrations of bromide ions and hydrogen peroxide are determined at the contact of the bromide ions and the hydrogen peroxide, that is to say at the point of contact PC of the compositions B and H. Thus, the point of contact PC corresponds to the mixing of the compositions B and H.

Figure 6:
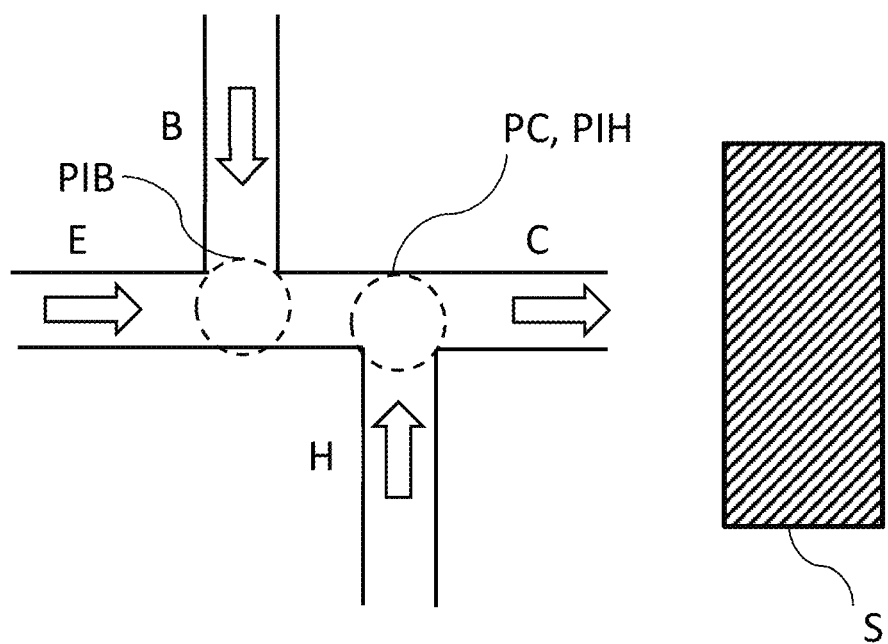
FIG. 6 is a diagram of a second embodiment of the step of preparation of the aqueous chemical composition C according to the invention.

In a second alternative, as illustrated in FIG. 6, the mixing step takes place by injecting the composition B at an injection point PIB into a flow of water E and by injecting the composition H into said flow of water E at an injection point PIH, the injection point PIB being upstream of the injection point PIH, to form a flow of aqueous composition C according to the invention. The injection point PIH then corresponds to the point of contact PC of the two compositions B and H.

Preferably, the injections of the compositions B and H take place simultaneously.

In this alternative, the molar concentrations of bromide ions and hydrogen peroxide are determined at the contact of the bromide ions and the hydrogen peroxide, that is to say at the point of contact PC of the compositions B and H. Thus, the point of contact PC, which is also the injection point PIH, corresponds to the mixing of the compositions B and H.

Figure 7:
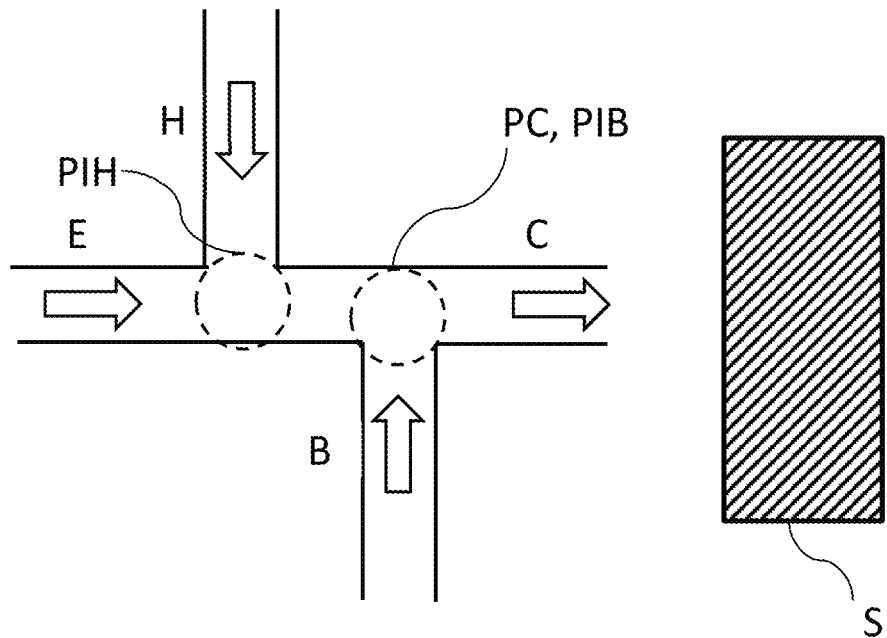
FIG. 7 is a diagram of a third embodiment of the step of preparation of the aqueous chemical composition C according to the invention.

In a third alternative, as illustrated in FIG. 7, the mixing step takes place by injecting the composition H at an injection point PIH into a flow of water E and by injecting the composition B into said flow of water E at an injection point PIB, the injection point PIH being upstream of the injection point PIB, to form a flow of aqueous composition C according to the invention. The injection point PIB then corresponds to the point of contact PC of the two compositions B and H.

Preferably, the injections of the compositions B and H take place simultaneously.

In this alternative, the molar concentrations of bromide ions and hydrogen peroxide are determined at the contact of the bromide ions and the hydrogen peroxide, that is to say at the point of contact PC of the compositions B and H. Thus, the point of contact PC, which is also the injection point PIB, corresponds to the mixing of the compositions B and H.

In the first, second and third alternatives, preferably, the flow of water is at a temperature greater than 70° C., more preferentially greater than 75° C., in particular comprised between 75° C. and 95° C.

In the first, second and third alternatives, in particular, the composition B comprises hydrobromic acid and the composition H comprises hydrogen peroxide aqueous solution. More particularly, the mixing step takes place by injecting into a flow of water hydrobromic acid and hydrogen peroxide aqueous solution.

In the first, second and third alternatives, advantageously, mixing takes place by injecting into a flow of water hydrobromic acid at 48% mass concentration, at a volumetric flow rate comprised between 2% and 5.5% of the water volumetric flow rate, and hydrogen peroxide aqueous solution at 30% mass concentration, at a volumetric flow rate comprised between 0.5 times and two times the hydrobromic acid volumetric flow rate.

In the first, second and third alternatives, advantageously, mixing takes place by injecting into a flow of water hydrobromic acid at 48% mass concentration, at a volumetric flow rate comprised between 2% and 5.5% of the water volumetric flow rate, and hydrogen peroxide aqueous solution at 30% mass concentration, at a volumetric flow rate comprised between one times and two times the hydrobromic acid volumetric flow rate.

In the first, second and third alternatives, in particular, mixing takes place by injecting into a flow of water hydrobromic acid at 48% mass concentration, at a volumetric flow rate comprised between 2% and 5.5% of the water volumetric flow rate, and hydrogen peroxide aqueous solution at 30% mass concentration, at a volumetric flow rate comprised between 0.63 times and 1.14 times the hydrobromic acid volumetric flow rate.

In the first, second and third alternatives, preferably, the composition B comprises hydrogen bromide and the composition H comprises hydrogen peroxide aqueous solution, and the mixing step takes place by injecting hydrogen peroxide aqueous solution and by diffusing the hydrogen bromide in a flow of water.

According to a preferred embodiment, the composition is manufactured by injecting at the point of use, into a flow of water heated to a temperature greater than 75° C., a small quantity of bromide ions, derived from hydrobromic acid at 48% mass concentration, at a flow rate comprised between 2% and 5.5% of the water volumetric flow rate, and a flow rate of hydrogen peroxide aqueous solution, at 30% mass concentration, comprised between 2% and 6% of the water volumetric flow rate.

Manufacturing the composition at the point of use signifies that the source of bromide ions, the hydrogen peroxide aqueous solution, and the water are mixed just before placing the composition obtained in contact with the substrate to clean. The total flow rate of the mixture of these three constituents, forming the composition, is chosen as a function of the method used to place said composition in contact with the substrate to clean.

Figure 8:
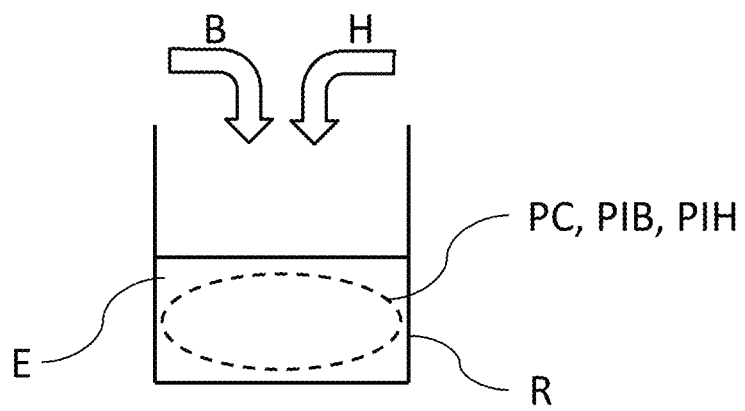
FIG. 8 is a diagram of a fourth embodiment of the step of preparation of the aqueous chemical composition C according to the invention.

In a fourth alternative, as illustrated in FIG. 8, the composition B and the composition H are mixed in a tank R comprising or not water E.

Advantageously, the composition B, the composition H and optionally water are mixed and heated in a tank R, more advantageously at a temperature greater than 70° C., more preferentially greater than 75° C., in particular comprised between 75° C. and 95° C.

In particular, the composition B is mixed with water in the tank R, then the composition H is added. More particularly, the composition B is mixed with water in the tank R, then advantageously heated to a temperature greater than 70° C., more preferentially greater than 75° C., in particular comprised between 75° C. and 95° C., then the composition H is added.

Alternatively, the composition H is mixed with water, then the composition B is added. Preferably, the composition H is mixed with water, then the composition B is added to obtain the composition C which is next heated advantageously to a temperature greater than 70° C., more preferentially greater than 75° C., in particular comprised between 75° C. and 95° C.

According to an embodiment, the bromide ions, the hydrogen peroxide aqueous solution and the water are mixed and heated in a tank, then the substrate is immersed in the mixture inside the tank. The placing of the substrate and the composition in contact then takes place by immersion of the substrate in the composition. Other techniques of placing the substrate and the composition in contact may be used without however going beyond the scope of the invention, such as for example spray coating of the substrate with the composition.

The solution is implemented at a temperature greater than or equal to 70° C., in order to reduce the cleaning time.

In this case, during the manufacture of the composition, the water is preferably heated to a temperature greater than 75° C. then mixed at this temperature with the hydrogen peroxide aqueous solution and with the bromide ions, such that the composition obtained has a temperature greater than or equal to 70° C.

Step b)

The aqueous composition C described previously is placed in contact with the substrate to treat for a sufficient duration to remove the nickel-platinum alloy residues from the substrate.

The placing in contact time corresponds to the minimum time necessary to obtain a complete removal of the residues, and is a function of the conditions of use, notably the industrial equipment used. This method has the advantage of being directly utilisable by most wet treatment equipment, without involving notable modification to the production line.

In particular, the sufficient duration for removing the nickel-platinum alloy residues from the substrate is comprised between 30 sec and 10 min, preferably between 1 min and 8 min, more preferentially between 2 min and 7 min.

The placing of the substrate and the aqueous composition C in contact may take place by immersion of the substrate in the composition C, in particular when the composition C is prepared according to the described third alternative of the preparation method.

Other techniques of placing the substrate and the aqueous composition C in contact may be used without however going beyond the scope of the invention.

Notably, the placing of the substrate and the aqueous composition C in contact may take place by spray coating of the substrate with the composition C, in particular when the composition C is prepared according to the described first, second or third alternatives of the method for preparing the composition C. During the preparation of the aqueous composition C according to the first, second and third alternatives, the total flow rate of the mixture of the source of bromide ions, the source of hydrogen peroxide aqueous solution and water, forming the composition C, is chosen as a function of the method used to place said composition C in contact with the substrate to clean.

In particular, the aqueous composition C is at a temperature greater than or equal to 70° C., more particularly greater than or equal to 75° C., even more particularly comprised between 75° C. and 95° C. while it is placed in contact with the substrate.

In particular the residues to remove selectively are residues of a Ni—Pt alloy containing at least 8% by weight of platinum, advantageously 8% to 15% by weight of platinum, compared to the total weight of nickel-platinum alloy.

Advantageously, the substrate is a transistor structure comprising nickel-platinum alloy residues formed by annealing during the manufacture of the transistor.

Preferably, the transistor is a MOS transistor, more preferentially manufactured according to FIGS. 1A, 1B, 1C, 1D and 1E, notably manufactured according to the method described in the state of the art paragraph.

In particular, step b) immediately follows step a). In other words, the composition C obtained at step a) is directly used in step b), notably without a step of storage of the composition C.

EXAMPLE

Removal of Nickel-Platinum Alloy Residues from a Substrate During the Manufacture of a Transistor Coupons are used each comprising a structure comprising a deposition of nickel-platinum with 10% by weight of platinum of around 10 nm thickness, surmounted by a titanium nitride layer of around 10 nm thickness having undergone a first high temperature annealing to form a first metal rich silicide phase.

In examples 1 to 5, the coupons were immersed in 5 beakers of 50 mL in which a mixture of hydrobromic acid having a mass concentration of 48% and water was firstly heated to the temperature of use, then hydrogen peroxide aqueous solution having a mass concentration of 30% was added just before the immersion of the coupons according to the proportions indicated in table 1 below.

In example 6, the coupons were immersed in 1 beaker of 50 mL in which a mixture of hydrobromic acid having a mass concentration of 48%, hydrochloric acid having a mass concentration of 37% and water was firstly heated to the temperature of use, then hydrogen peroxide aqueous solution was added just before the immersion of the coupons according to the proportions indicated in table 1 below.

In example 7, the coupons were immersed in 1 beaker of 50 mL in which a mixture of hydrochloric acid having a mass concentration of 37% and water was firstly heated to the temperature of use, then hydrogen peroxide aqueous solution having a mass concentration of 30% was added just before the immersion of the coupons according to the proportions indicated in table 2 below.

In the 7 examples, throughout the immersion time, the coupons were slowly agitated.

The coupons were taken out of the beakers, then they were observed by scanning electron microscope in order to determine the presence or not of nickel-platinum alloy residues.

Full wafer coupons (without structure) of silicides covered with the same deposits of nickel platinum and titanium nitride, and having undergone the same annealing were used to determine the aggressiveness of the solution vis-à-vis the silicides and immersed at the same time as the structured coupons at each test.

A four point probe resistance measurement made it possible to verify the innocuity of the solution for the silicide formed, a value of 6.9 to 7.1Ω corresponds to the thickness of the silicide formed.

The results are given in the table below.

TABLE 1

| Example | HBr (48%) vol % | Br— (mol/L) | Molar ratio HCl/Br— | $H_2O_2$ (30%) vol % | Molar ratio $H_2O_2$/Br— | Water Temperature (° C.) | Time (min) | Residues (O/N) | Silicide ($R^2$ - Ω) |
|---|---|---|---|---|---|---|---|---|---|
| 1 | 3 | 0.25 | 0 | 4.5 | 1.6 | 80 | 3.5 | N | 7 |
| 2 | 2 | 0.17 | 0 | 2 | 1.1 | 80 | 5.5 | N | 6.9 |
| 3 | 5 | 0.40 | 0 | 6 | 1.3 | 80 | 2.5 | N | 7.1 |
| 4 | 3 | 0.25 | 0 | 2 | 0.7 | 80 | 3.5 | O | 6.8 |
| 5 | 3 | 0.25 | 0 | 4.5 | 1.6 | 65 | 6 | O | 6.6 |
| 6 | 3 | 0.25 | 0.17 | 4.5 | 1.6 | 80 | 2.5 | N | 6.9 |

TABLE 2

| Example | HCl (37%) vol % | Cl— (mol/L) | $H_2O_2$ (30%) vol % | Molar ratio $H_2O_2$/Cl— | Water Temperature (° C.) | Time (min) | Residues (O/N) | Silicide ($R^2$ - Ω) |
|---|---|---|---|---|---|---|---|---|
| 7 | 5 | 0.61 | 5 | 0.8 | 80 | 5 | O | 7.8 |

In examples 1, 2, and 3, the constituents of the compositions used have a molar concentration included in the ranges described previously between 0.15 mol/L and 0.45 mol/L for bromide ions, and a molar ratio between 1.1 and 2 for the hydrogen peroxide aqueous solution.

In particular, the composition of example 1 comprises average molar concentrations of bromide ions and hydrogen peroxide aqueous solution, the composition of example 2 comprises molar concentrations corresponding to the lower bounds, and the composition of example 3 comprises a molar concentration of bromide ions corresponding to the upper bound of bromide ions.

Figure 2:
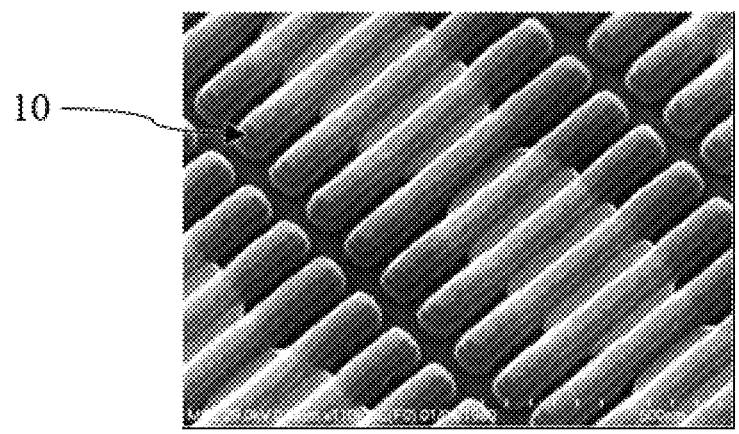
FIG. 2A is a first scanning electron microscope view of a structure of a transistor after removal of residues, said residues having been totally removed.
FIG. 2B is a second scanning electron microscope view of the structure of FIG. 2A.
Figure 2:
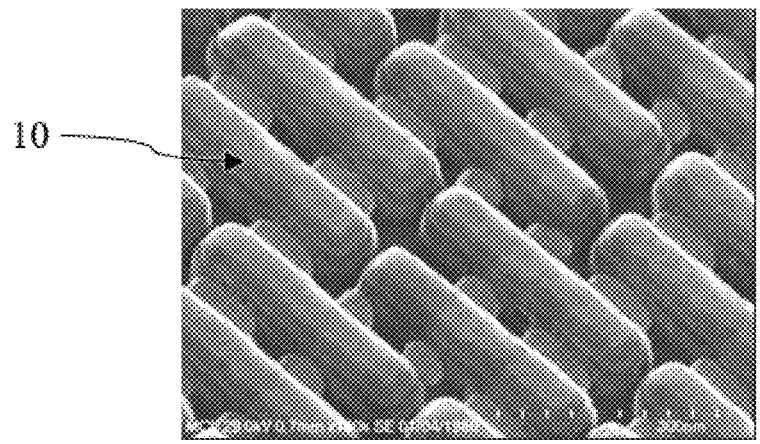

For these three examples 1, 2, and 3, the residues are totally eliminated (residues absent, symbol N), whatever the time of placing the composition in contact with the substrate (cleaning time). This is confirmed by FIGS. 2A and 2B which represent scanning electron microscope views of the structure of the transistor 10 after cleaning, on which no residue is visible.

Figure 3:
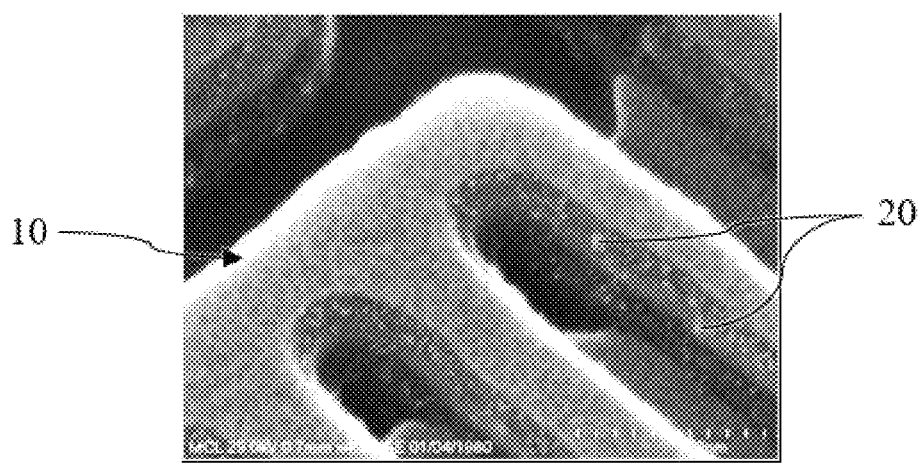
FIG. 3 is a scanning electron microscope view of a structure of a transistor after removal of residues, said residues having only been partially removed.

Example 4 differs from example 1 in that the molar ratio of hydrogen peroxide aqueous solution with respect to bromide ions is equal to 0.7. In this case, the residues are not totally eliminated (residues present, symbol ◯), despite a moderate cleaning time. This is confirmed by FIG. 3 which represents a scanning electron microscope view of the structure of the transistor 10 after cleaning, on which residues 20 are still visible in the form of small surface stains.

Example 5 differs from example 1 in that the water temperature, approximately equal to the temperature of the composition, is 65° C., that is to say below 70° C. In this case, the residues are not totally eliminated, despite a longer cleaning time.

Example 6 differs from example 1 by the supplementary presence of hydrochloric acid in the composition, and makes it possible to have a very efficient cleaning in a reduced time.

Figure 4:
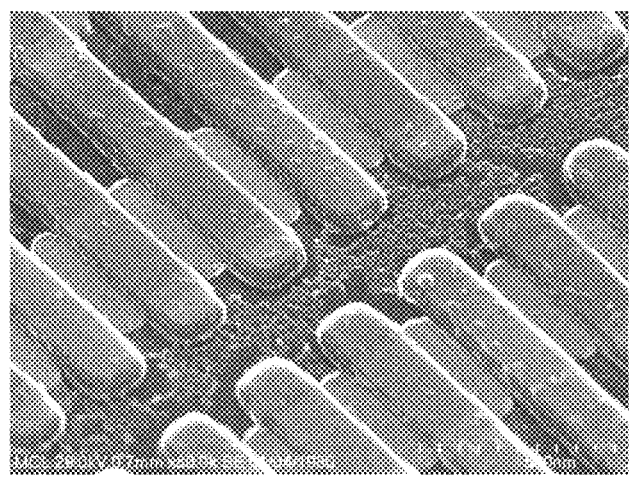
FIG. 4 is a scanning electron microscope view of a structure of a transistor after removal of residues after SC2 treatment, said residues having only been partially removed.

In example 7, the unique presence of hydrochloric acid does not make it possible to have complete cleaning of the structures. This is confirmed by FIG. 4 which represents a scanning electron microscope view of the structure of the transistor 10 after cleaning on which residues are still visible in the form of "platinum gate" surface stains. In addition, it seems that the silicide is beginning to be attacked.

The invention claimed is:

1. A method for selectively removing from a substrate under heat residues of a nickel-platinum alloy containing at least 8% by weight of Pt compared to the total weight of nickel-platinum alloy comprising a step of contacting the substrate and an aqueous chemical composition C constituted of a source of bromide ions, hydrogen peroxide aqueous solution, and water, and, optionally, a source of chloride ions, wherein bromide ions are at a molar concentration comprised between 0.15 mol/L and 0.45 mol/L, hydrogen peroxide is at a molar ratio with respect to bromide ions comprised between 1.1 and 2 and chloride ions are at a molar ratio with respect to bromide ions less than or equal to 0.25.

2. The method according to claim 1, wherein the chemical composition C is prepared under heat by mixing a composition B constituted of a source of bromide ions, water and optionally a source of chloride ions and a composition H being a hydrogen peroxide solution.

3. The method according to claim 2, wherein the chemical composition C is prepared by heating the composition B to a temperature greater than 75° C. before addition of the composition H.

4. The method according to claim 1, wherein the chemical composition C is prepared by injecting into a flow of water hydrobromic acid having a mass concentration of 48%, as composition B, at a flow rate comprised between 2% and 5.5% of the water volumetric flow rate, and hydrogen peroxide aqueous solution having a mass concentration of 30%, as composition H, at a volumetric flow rate comprised between one and two times the hydrobromic acid volumetric flow rate.

5. The method according to claim 1, wherein the chemical composition C is at a temperature greater than or equal to 70° C. while it is placed in contact with the substrate.

6. The method according to claim 1, wherein the substrate is a transistor structure comprising nickel-platinum alloy residues formed by annealing during the manufacture of the transistor.

7. The method according to claim 1, wherein the residues to remove selectively are residues of a Ni—Pt alloy containing from 8% to 15% by weight of platinum, compared to the total weight of nickel-platinum alloy.

8. The method according to claim 2, wherein the chemical composition is prepared by heating the composition B to a temperature greater than 75° C. before addition of the composition H, and the chemical composition C is prepared by injecting into a flow of water hydrobromic acid having a mass concentration of 48%, as composition B, at a flow rate comprised between 2% and 5.5% of the water volumetric flow rate, and hydrogen peroxide aqueous solution having a mass concentration of 30%, as composition H, at a volumetric flow rate comprised between one and two times the hydrobromic acid volumetric flow rate.

9. The method according to claim 1, wherein the source of bromide ions is hydrobromic acid, a bromide salt or hydrogen bromide.

* * * * *